US011158773B2

United States Patent
Oh et al.

(10) Patent No.: US 11,158,773 B2
(45) Date of Patent: Oct. 26, 2021

(54) LED PACKAGE

(71) Applicant: LUMENS CO., LTD., Yongin-si (KR)

(72) Inventors: Seunghyun Oh, Yongin-si (KR); Sungsik Jo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 65 days.

(21) Appl. No.: 16/623,754

(22) PCT Filed: Jun. 4, 2018

(86) PCT No.: PCT/KR2018/006351
§ 371 (c)(1),
(2) Date: Dec. 17, 2019

(87) PCT Pub. No.: WO2019/017588
PCT Pub. Date: Jan. 24, 2019

(65) Prior Publication Data
US 2020/0135995 A1  Apr. 30, 2020

(30) Foreign Application Priority Data

Jul. 19, 2017 (KR) ......................... 10-2017-0091688
Oct. 19, 2017 (KR) ......................... 10-2017-0135583

(51) Int. Cl.
*H01L 33/58* (2010.01)
*H01L 33/60* (2010.01)
(Continued)

(52) U.S. Cl.
CPC ............ *H01L 33/58* (2013.01); *H01L 23/544* (2013.01); *H01L 33/486* (2013.01); *H01L 33/60* (2013.01); *H01L 2223/54426* (2013.01)

(58) Field of Classification Search
CPC ..... H01L 33/60; H01L 23/544; H01L 33/486; H01L 2223/54426; H01L 33/58
See application file for complete search history.

(56) References Cited

U.S. PATENT DOCUMENTS 10,355,183 B2    7/2019  Iwaki
2013/0270588 A1*  10/2013  Wang .................... H01L 23/495
                                                          257/91
(Continued)

FOREIGN PATENT DOCUMENTS

JP           2013-251105 A    12/2013
KR     10-2014-0098610 A      8/2014
(Continued)

*Primary Examiner* — Feifei Yeung Lopez
(74) *Attorney, Agent, or Firm* — Mei & Mark LLP

(57) ABSTRACT

An LED package is disclosed. The LED package includes: a base including a chip mounting surface; an LED chip including a central axis line perpendicular to the chip mounting surface; a total internal reflection (TIR) lens having a refractive index higher than that of a medium covering the upper and side surfaces of the LED chip and including entrance planes bordering the medium and exit planes from which light entering through the entrance planes is emitted; and a reflector coupled to the TIR lens. The entrance planes include main entrance planes having one or more radii of curvature and protruding toward the LED chip and a pair of lateral entrance planes connected to the main entrance planes at the edges of the main entrance planes and extending downward from the main entrance planes. The exit planes include a main exit plane located above the main entrance planes and a pair of lateral exit planes connected to the main exit plane at the edges of the main exit plane, extending downward from the main exit plane, and connected to the pair of lateral entrance planes. Two points on the main entrance planes at the same height from the LED chip are not equidistant from the central axis line such that the amount of light passing through the main entrance planes is localized to one side of the central axis line.

17 Claims, 11 Drawing Sheets

(51) Int. Cl.
*H01L 23/544* (2006.01)
*H01L 33/48* (2010.01)

(56) References Cited

U.S. PATENT DOCUMENTS

2017/0084803 A1* 3/2017 Iwaki ...................... H01L 33/60
2018/0231213 A1* 8/2018 Kang ........................ F21V 5/04

FOREIGN PATENT DOCUMENTS

| KR | 10-1504282 B  |   | 3/2015  |
| KR | 101504282     | * | 3/2015  |
| KR | 10-2016-0000647 A | | 1/2016 |
| WO | WO2016200012  | * | 12/2016 |

* cited by examiner

[FIG. 1]
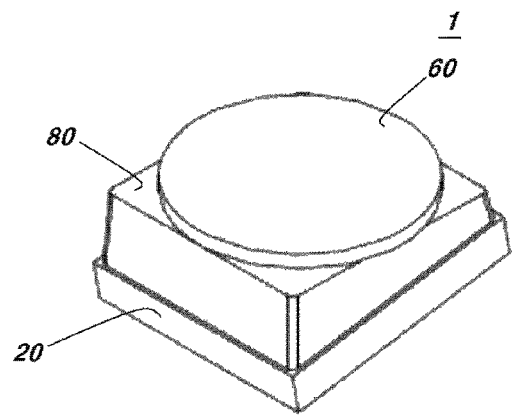
[FIG. 2]
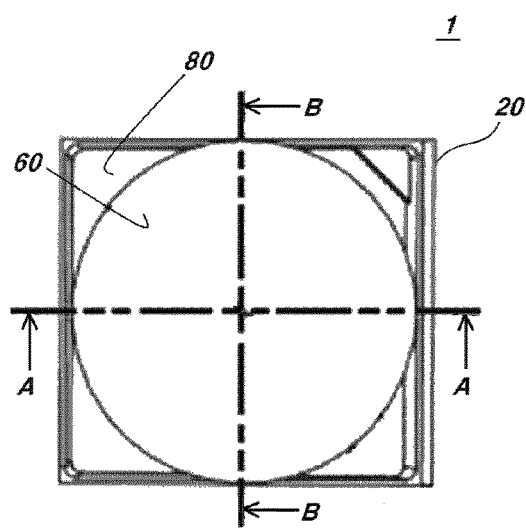

[FIG. 3]
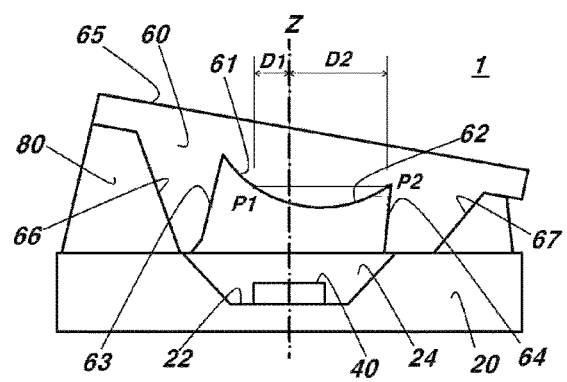
[FIG. 4]
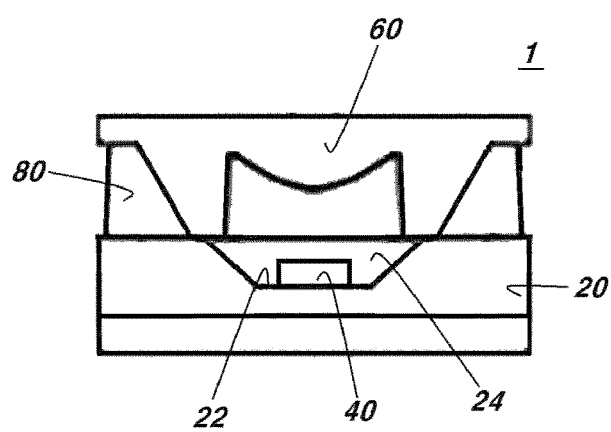

[FIG. 5]
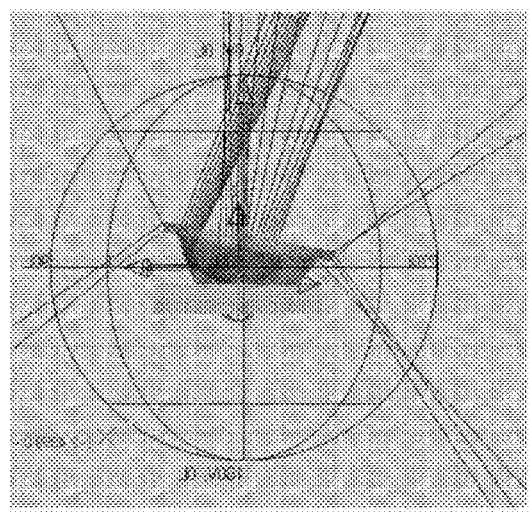
[FIG. 6]
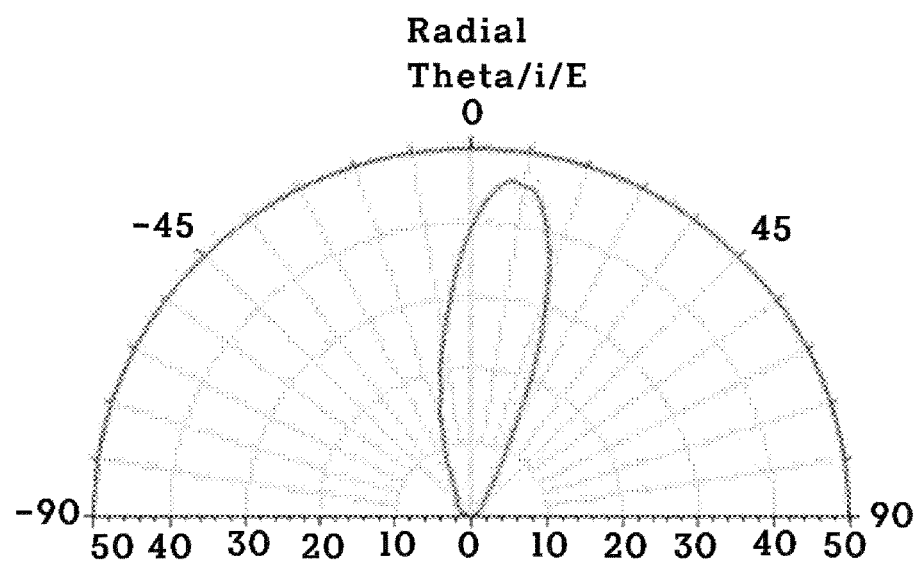

[FIG. 7]
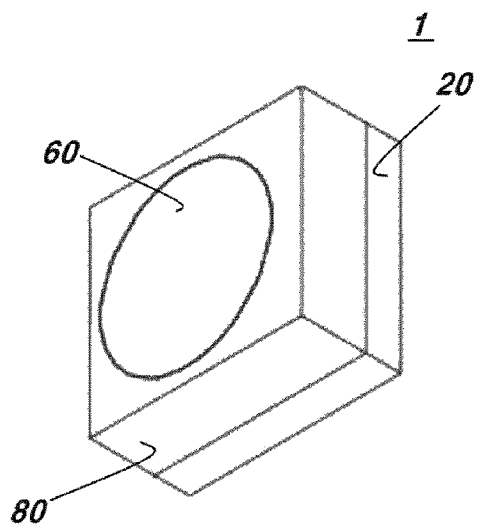
[FIG. 8]
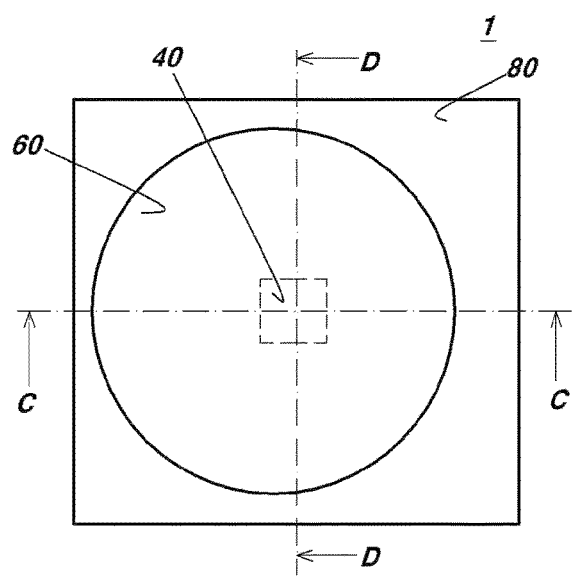

[FIG. 9]
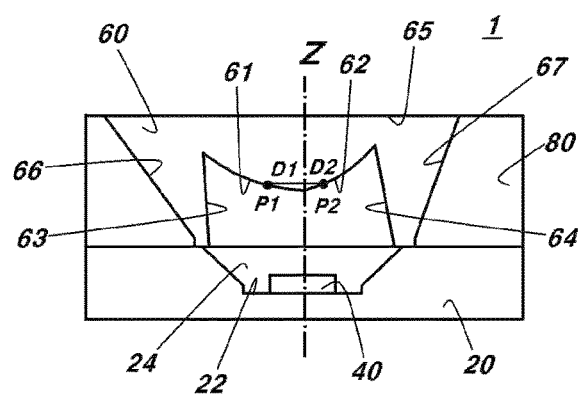
[FIG. 10]
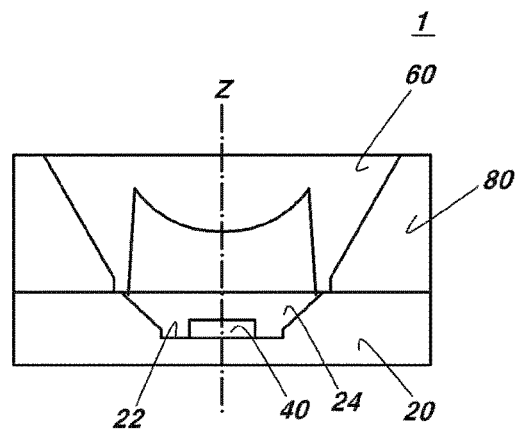

[FIG. 11]
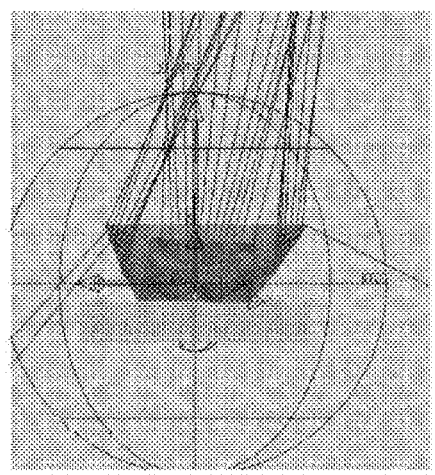
[FIG. 12]
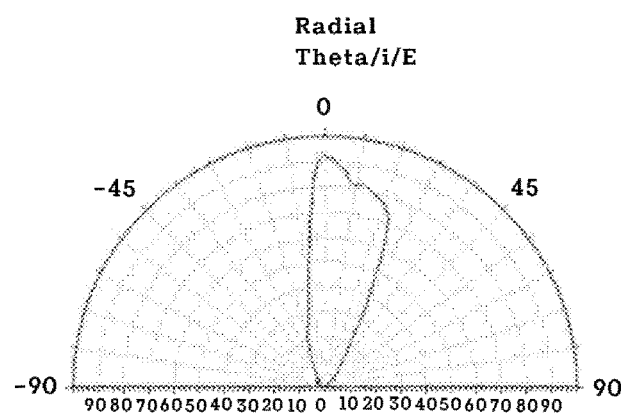

[FIG. 13]
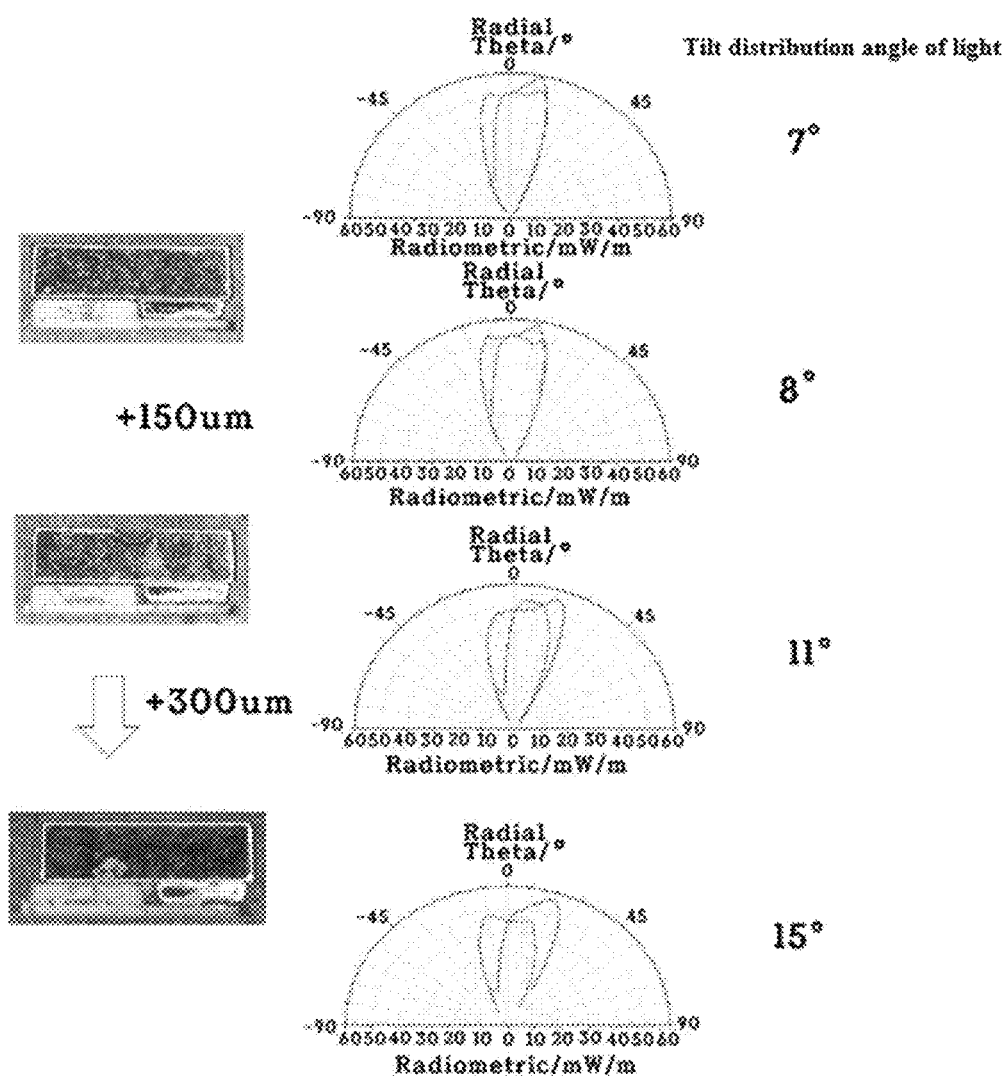

[FIG. 14]
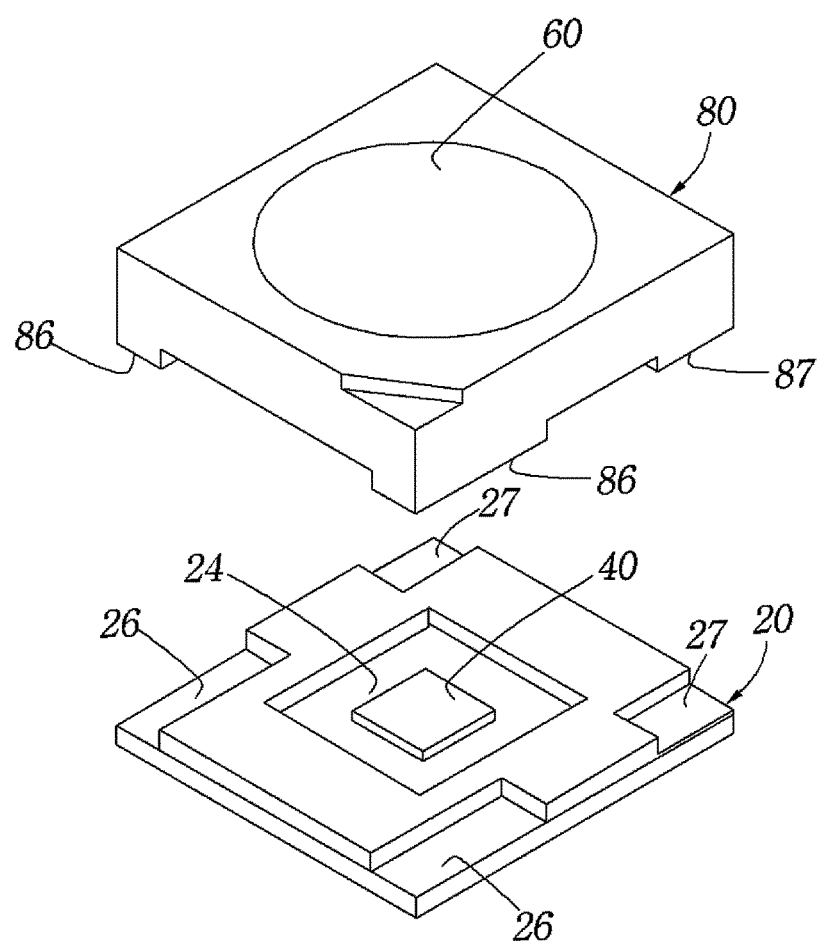

[FIG. 15]
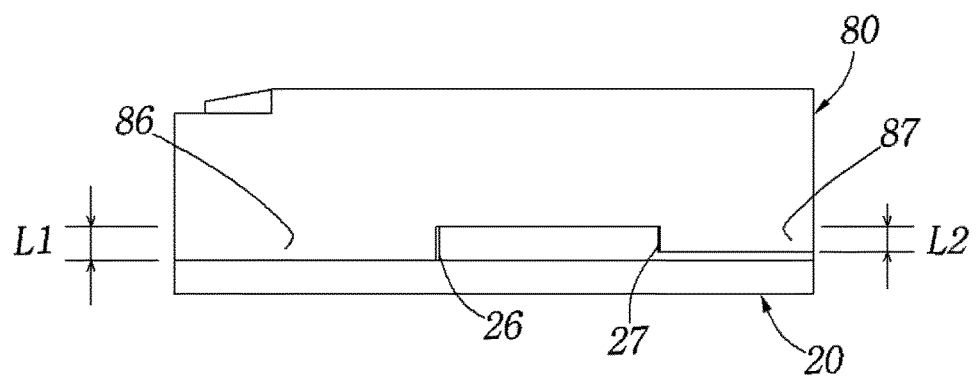
[FIG. 16]
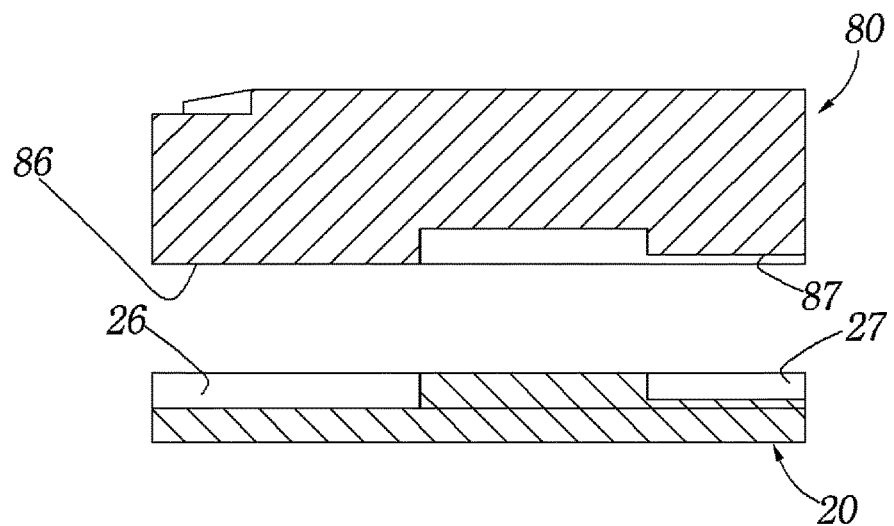

[FIG. 17]
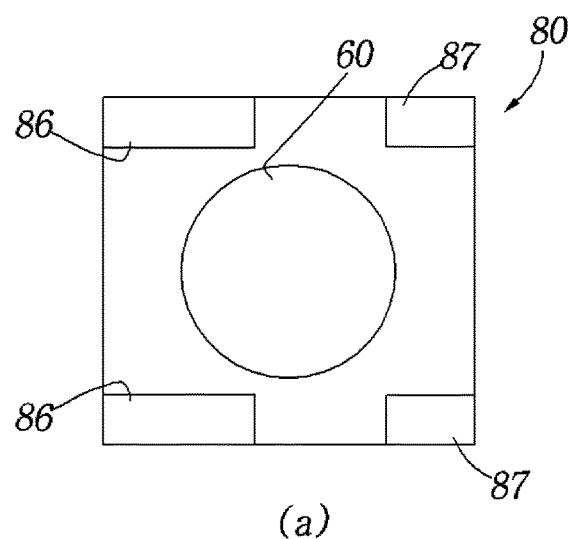
(a)
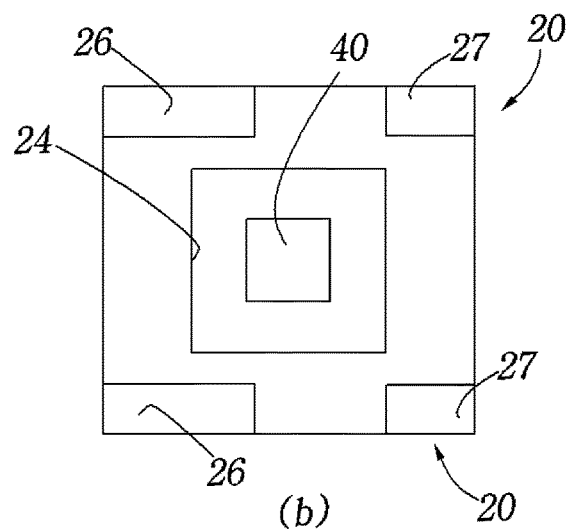
(b)

【FIG. 18】
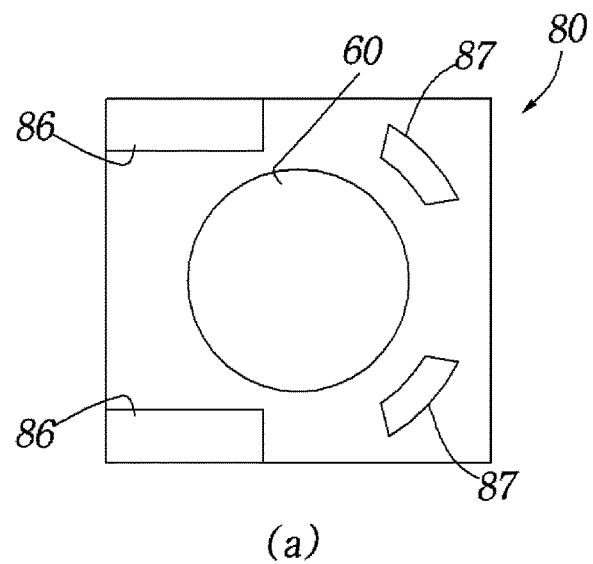
(a)
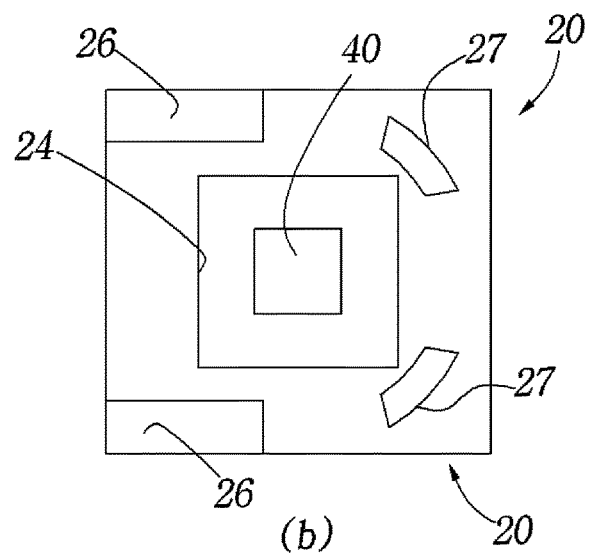
(b)

LED PACKAGE

TECHNICAL FIELD

The present invention relates to an LED package, and more specifically to an LED package including a total internal reflection (TIR) lens and a reflector and whose light distribution angle pattern can be inclined to a desired level based on the simple shape and slope variation of the TIR lens and/or the characteristics of the reflector. The present invention also relates to an LED package in which a very accurate light distribution angle pattern inclined to a desired level can be achieved based on a technique for improving the alignment precision of a reflector relative to a base mounted with a chip to minimize viewing angle errors.

BACKGROUND ART

A need exists for LED packages whose light distribution angle pattern is inclined to a desired level (i.e. fine-tuned to a desired slope). In iris recognition, a person is required to stare at a light source positioned in front of him/her. In this case, light with a given intensity is illuminated on the eye and overlaps with light reflected from the eye, losing its intensity. In specific applications such as iris recognition, much research has been conducted to develop LED packages that have an inclined light distribution angle pattern. As a result of the research, techniques have been proposed for changing light distribution angles based on errors in the location of a light source and a secondary lens or changing light distribution angle patterns using a Fresnel lens or prism. The technique for inclining light distribution angles based on errors in the location of a light source and a secondary lens requires the use of a molded/injection molded domed lens in an LED package or chip. However, the lens is difficult to produce by D/P molding and a molding deviation between the LED and the lens leads to poor precision of distribution angle variations. The technique for inclining light distribution angles using a sophisticatedly designed Fresnel lens or prism requires the molding of a precise acute pattern in the lens, making it difficult to produce the lens. The precise processing of the lens disadvantageously leads to low yield.

DETAILED DESCRIPTION OF THE INVENTION

Technical Tasks

The present invention has been made in an effort to solve the above problems, and one object of the present invention is to provide an LED package whose light distribution angle pattern can be inclined to a desired level based on the simple shape and slope variation of a TIR lens and/or the characteristics of a reflector.

An LED package can be constructed by securely bonding a reflector coupled with a TIR lens onto a base mounted with an LED chip by SMT. In this case, there is a possibility that the reflector may be falsely located, resulting in imprecise alignment of the reflector and the TIR lens coupled thereto. In attempts to improve the alignment of the reflector and the TIR lens, a pair of alignment protrusions are formed at one side of the bottom surface of the reflector, alignment grooves, each having one open side, are formed on the upper surface of the base, and the reflector is mounted and aligned on the base such that the sides of the alignment protrusions come into close contact with the corresponding sides of the alignment grooves. However, the melting of a solder during SMT (particularly reflow) for mounting the reflector on the base causes separation between the sides of the alignment protrusions and the corresponding sides of the alignment grooves, which greatly deteriorates the alignment precision of the reflector and the TIR lens coupled thereto.

Thus, another further object of the present invention is to provide an LED package that has a structure in which a reflector having alignment protrusions is mounted on a base having alignment grooves, each having one open side, and avoids the problem of poor alignment precision of the reflector encountered when the alignment protrusions are moved away from the corresponding sides of the alignment grooves during mounting of the reflector.

Technical Solutions

An LED package according to one aspect of the present invention includes: a base including a chip mounting surface; an LED chip including a central axis line perpendicular to the chip mounting surface; a total internal reflection (TIR) lens having a refractive index higher than that of a medium covering the upper and side surfaces of the LED chip and including entrance planes bordering the medium and exit planes from which light entering through the entrance planes is emitted; and a reflector coupled to the TIR lens, wherein the entrance planes include main entrance planes having one or more radii of curvature and protruding toward the LED chip and a pair of lateral entrance planes connected to the main entrance planes at the edges of the main entrance planes and extending downward from the main entrance planes; the exit planes include a main exit plane located above the main entrance planes and a pair of lateral exit planes connected to the main exit plane at the edges of the main exit plane, extending downward from the main exit plane, and connected to the pair of lateral entrance planes; and two points on the main entrance planes at the same height from the LED chip are not equidistant from the central axis line such that the amount of light passing through the main entrance planes is localized to one side of the central axis line.

According to one embodiment, the main entrance planes include a first main entrance plane and a second main entrance plane divided from each other by the central axis line and the second main entrance plane is more downwardly biased than the first main entrance plane.

According to one embodiment, the first main entrance plane has the same center of curvature and the same radius of curvature as the second main entrance plane.

According to one embodiment, the pair of lateral exit planes have different heights and the main exit plane is inclined from the horizontal.

According to one embodiment, the pair of lateral exit planes include a first lateral exit plane and a second lateral exit plane whose upper end is lower than that of the first lateral exit plane; and the main exit plane is inclined downward from the first lateral exit plane to the second lateral exit plane.

According to one embodiment, the reflector is designed such that the amount of light reflected toward the main exit plane through the first lateral exit plane is larger than that of light reflected toward the main exit plane through the second lateral exit plane.

According to one embodiment, the main entrance planes include a first main entrance plane and a second main entrance plane divided from each other by the central axis line and have different centers of curvature; and the radius of curvature of the first main entrance plane is larger than that of the second main entrance plane.

According to one embodiment, the pair of lateral exit planes are at different angles to the central axis line.

According to one embodiment, the base includes one or more alignment grooves formed at the edges of one side of the upper surface thereof and one or more alignment retaining grooves formed at the edges of the other side of the upper surface thereof; the reflector includes one or more alignment protrusions formed at the edges of one side of the bottom surface thereof and one or more alignment retaining protrusions formed around the edges of the other side of the bottom surface thereof; and one side of each of the alignment protrusions is in tight contact with the corresponding side of the corresponding alignment groove and the alignment retaining protrusions are fitted into the corresponding alignment retaining grooves to prevent the alignment protrusions from being moved away from the corresponding sides of the alignment grooves.

According to one embodiment, each of the alignment grooves has a quadrangular cross-sectional shape in which two outer sides meet at right angles and are open.

According to one embodiment, each of the alignment retaining grooves has a quadrangular cross-sectional shape in which two outer sides meet at right angles and are open.

According to one embodiment, the alignment retaining grooves are in the form of circular arcs.

According to one embodiment, the alignment grooves are deeper than the alignment retaining grooves and the alignment protrusions extend more downward than the alignment retaining protrusions.

According to one embodiment, the alignment grooves are formed at both edge corners of one side of the upper surface of the base and the alignment retaining grooves are formed at both edge corners of the other side of the upper surface of the base.

Effects of the Invention

In the LED package of the present invention, the simple shape of the TIR lens and the reflector in cooperation with the TIR lens enable the formation of a light distribution angle pattern inclined to a desired level. In addition, a fine-tuned light distribution angle pattern can be obtained due to the simple shape and slope variation of the TIR lens and/or the reflection plane of the reflector in contact with the lateral exit planes of the TIR lens.

Furthermore, one side of each of the alignment protrusions of the reflector can be maintained in close contact with the corresponding side of the corresponding alignment groove of the base during SMT due to engagement between the alignment retaining protrusions of the reflector and the alignment retaining grooves of the base. This solves the problem of poor alignment precision of the reflector and the TIR lens coupled to the reflector with respect to the LED chip.

BRIEF DESCRIPTION OF THE DRAWINGS

FIG. 1 is a perspective view illustrating an LED package according to a first embodiment of the present invention.

FIG. 2 is a plan view illustrating the LED package according to the first embodiment of the present invention.

FIG. 3 is a cross-sectional view taken along line A-A of FIG. 1.

FIG. 4 is a cross-sectional view taken along line B-B of FIG. 1.

FIG. 5 is a simulation diagram illustrating the distribution angles of light from the LED package according to the first embodiment of the present invention.

FIG. 6 compares a distribution angle pattern of light from the LED package according to the first embodiment of the present invention with that from a comparative LED package.

FIG. 7 is a perspective view illustrating an LED package according to a second embodiment of the present invention.

FIG. 8 is a plan view illustrating the LED package according to the second embodiment of the present invention.

FIG. 9 is a cross-sectional view taken along line C-C of FIG. 7.

FIG. 10 is a cross-sectional view taken along line D-D of FIG. 7.

FIG. 11 is a simulation diagram illustrating the distribution angles of light from the LED package according to the second embodiment of the present invention.

FIG. 12 compares a distribution angle pattern of light from the LED package according to the second embodiment of the present invention with that from a comparative LED package.

FIG. 13 shows a change in the tilt distribution angle of light from an LED package when a reflector is shifted due to the fluidity of a solder during SMT.

FIG. 14 is an exploded perspective view illustrating an LED package including a base formed with alignment grooves and alignment retaining grooves and a reflector formed with alignment protrusions and alignment retaining protrusions.

FIG. 15 is a side view illustrating the LED package of FIG. 14.

FIG. 16 is an exploded cross-sectional view illustrating the LED package of FIGS. 14 and 15.

FIG. 17 illustrates the lower surface of the reflector and the upper surface of the base in the LED package of FIGS. 14 to 16.

FIG. 18 illustrates the lower surface of a reflector having arc-shaped alignment retaining protrusions and the upper surface of a base having alignment retaining grooves corresponding to the alignment retaining protrusions in an LED package according to one embodiment of the present invention.

BEST MODE FOR CARRYING OUT THE INVENTION

Preferred embodiments of the present invention will now be described with reference to the accompanying drawings. The drawings and their description are intended to assist in understanding the present invention. Therefore, the drawings and the description should not be construed as limiting the scope of the present invention.

Referring to FIGS. 1 to 4, an LED package 1 according to a first embodiment of the present invention includes a base 20, an LED chip 40, a TIR lens 60, and a reflector 80.

The base 20 may be, for example, a lead frame, a substrate or a package body including lead terminals. The base 20 includes a chip mounting surface 22 parallel to its flat bottom surface. The chip mounting surface 22 is preferably a flat inner bottom of a recess 24 depressed from the upper surface of the base 20. The LED chip 40 includes a light emitting surface and an imaginary central axis line Z perpendicular to the chip mounting surface 22 of the base 20. The base 20 includes upper electrode pads disposed on the upper surface thereof and electrically connected to electrodes of the LED chip 40 by flip-chip bonding or wire bonding and lower electrode pads bonded to an external substrate on the bottom surface thereof.

The TIR lens 60 is integrally coupled to the reflector 80. The TIR lens 60 includes entrance planes 61, 62, 63, and 64 on which light emitted from the LED chip 40 is incident and exit planes 65, 66, and 67 from which light entering through the entrance planes 61, 62, 63, and 64 is emitted. When the TIR lens 60 and the reflector 80 integrated with the TIR lens 60 are bonded to the upper surface of the base 20, a space filled with a medium (preferably air) having a lower refractive index than that of the TIR lens 60 is formed between the TIR lens 60 and the base 20. Since the LED chip 40 is mounted on the chip mounting surface 22 of the base 20 in the medium-filled space, the upper and side surfaces of the LED chip 40 are covered with the medium. The entrance planes 61, 62, 63, and 64 of the TIR lens 60 border the medium. Light entering the TIR lens 60 through the entrance planes 61, 62, 63, and 64 exits through the exit planes 65, 66, and 67.

The reflector 80 has an asymmetric structure relative to the central axis line Z and is integrated with the TIR lens 60 in a cavity thereof. The cavity of the reflector 80 includes a lower hole into which the TIR lens 60 is fitted, an upper hole through which light is finally allowed to pass, and a lateral reflection plane connecting the lower hole to the upper hole.

FIG. 3 illustrates cross sections of the TIR lens 60 and the reflector 80. The main entrance planes 61 and 62 of the TIR lens 60 have a single radius of curvature and protrude toward the LED chip 40. The pair of lateral entrance planes 63 and 64 are connected to the main entrance planes 61 and 62 at the edges of the main entrance planes 61 and 62 and extend downward from the main entrance planes 61 and 62. The main exit plane 65 of the TIR lens 60 is located above the main entrance planes 61 and 62. The pair of lateral exit planes 66 and 67 of the TIR lens 60 are connected to the main exit plane 65 at the edges of the main exit plane 65, extend downward from the main exit plane 65, and are connected to the pair of lateral entrance planes 63 and 64.

Here, when the amount of light passing through the main entrance planes 61 and 62 is localized to one side (the right side of FIG. 3) of the central axis line Z, the distribution angle pattern of the light may be inclined to one side. As illustrated in FIG. 3, the LED package 1 is constructed such that the amount of light passing through the main entrance planes 61 and 62 is localized to one side (the right side) of the central axis line Z. According to this construction, two points P1 and P2 on the main entrance planes 61 and 62 at the same height from the LED chip 40 are at different distances D1 and D2 from the central axis line Z.

In contrast, in the case where two points on a symmetric main entrance plane at the same height from the LED chip are equidistant from the central axis line, the intensity of light is the highest at the center of the main entrance plane, making it impossible to obtain a one-side inclined light distribution angle pattern.

Referring again to FIG. 3, the first main entrance plane 61 and the second main entrance plane 62 are divided from each other by the central axis line Z. Since the main entrance planes 61 and 62 have a single radius of curvature, they have the same center of curvature and the same radius of curvature. Nevertheless, the first main entrance plane 61 ascends and the second main entrance plane 62 descends from a point passing through the central axis line Z. Due to this shape, the second main entrance plane 62 is more downwardly biased than the first main entrance plane 61.

The upper ends of the pair of lateral exit planes 66 and 67 connected to the main exit plane 65 at the edges of the main exit plane 65 have different heights. Thus, the main exit plane 65 is inclined from the horizontal. More specifically, the upper end of the second lateral exit plane 67 is lower than that of the first lateral exit plane 66 such that the main exit plane 65 is inclined downward from the upper end of the first lateral exit plane 66 to the upper end of the second lateral exit plane 67 to connect the upper ends of the two lateral exit planes 66 and 67. Light from the LED package 1 is finally emitted through the main exit plane 65. The main exit plane 65 is preferably inclined at the same slope as the slope of the tangent at the point of intersection between the main entrance planes 61 and 62 and the central axial line Z.

The reflector 80 is designed such that the amount of light reflected toward the main exit plane 65 through the first lateral exit plane 66 is larger than the amount of light reflected toward the main exit plane 65 through the second lateral exit plane 67. Particularly, the reflector 80 is designed such that the reflection plane bordering the first lateral exit plane 66 is used to reflect light emitted through the first lateral exit plane 66 toward the main exit plane 65.

Here, the first lateral exit plane 66 may be inclined to one side and its inclination angle can be determined such that the amount of light directly emitted through the main exit plane 65 without being reflected from the lateral exit plane is enhanced. In other words, the first angle between the first lateral exit plane 66 and the central axis line Z is larger than the second angle between the second lateral exit plane 67 and the central axis line Z so that light can be reflected at a larger angle from the reflection plane of the reflector 80 bordering the first lateral exit plane 66 to increase the amount of light in the right side of the central axis line Z.

Although not specifically illustrated, the LED package 1 has stepped portions for stoppers that adjoin the lower surface of the reflector 80 and the upper surface of the base 20 without tolerances. The stepped portions ensure assembly of the reflector 80 and the TIR lens 60 integrated with the reflector 80 in correct positions on the base 20. This allows the TIR lens 60 and the LED chip 40 to be located corresponding to each other to prevent the distribution angle pattern of light from deviating from the intended one by tolerances when assembled.

FIG. 5 is a simulation diagram illustrating the distribution angles of light from the LED package according to the first embodiment of the present invention. As can be seen from FIG. 5, the majority of light emitted from the LED chip 40 is directly emitted outward from the LED package through the main entrance planes 61 and 62 and the main exit plane 67. Here, the emitted light is slightly localized to the right side of the central axis line Z. Light emitted from the LED chip 40 is reflected from the reflection plane bordering the first lateral exit plane 66 located at the left side of the central axis line Z and is directed toward the main exit plane 65 at the right side of the central axis line Z. The first lateral exit plane 66 and the reflection plane of the reflector 80 bordering the first lateral exit plane 66 can increase the amount of light within predetermined angles to the central axis line Z and can enhance the uniformity of light emission in the intended direction.

FIG. 6 compares the distribution angle pattern of light from the LED package according to the first embodiment of the present invention with that from a comparative LED package. Referring to FIG. 6, the LED package according to the first embodiment of the present invention shows light distribution angles slightly inclined from the central axis line. In contrast, the comparative LED package having a structure in which a TIR lens and a reflector are symmetric to each other with respect to a central axis line of an LED chip forms a light distribution angle pattern around the central axis line (i.e. around 0°).

FIGS. 7 to 10 illustrate an LED package according to a second embodiment of the present invention. Referring to FIGS. 7 to 10, the LED package includes a base 20, an LED chip 40, a TIR lens 60, and a reflector 80, as in the previous embodiment.

The TIR lens 60 is integrally coupled to the reflector 80. The TIR lens 60 includes entrance planes 61, 62, 63, and 64 on which light emitted from the LED chip 40 is incident and exit planes 65, 66, and 67 from which light entering through the entrance planes 61, 62, 63, and 64 is emitted. A space filled with air as a medium having a lower refractive index than that of the TIR lens 60 is formed between the TIR lens 60 and the base 20. Since the LED chip 40 is mounted on the chip mounting surface 22 of the base 20 in the medium-filled space, the upper and side surfaces of the LED chip 40 are covered with the medium. The entrance planes of the TIR lens border the medium. Light entering the TIR lens 60 through the entrance planes exits through the exit planes.

The reflector 80 has an asymmetric structure relative to the central axis line Z and is integrated with the TIR lens 60 in a cavity thereof.

FIG. 9 illustrates cross sections of the TIR lens 60 and the reflector 80. The main entrance planes 61 and 62 of the TIR lens 60 have different centers of curvature and different radii of curvature and protrude toward the LED chip 40. The pair of lateral entrance planes 63 and 64 are connected to the main entrance planes 61 and 62 at the edges of the main entrance planes 61 and 62, border the reflection plane of the reflector 80, and extend downward from the main entrance planes 61 and 62. The main exit plane 65 is located above the main entrance planes 61 and 62. The pair of lateral exit planes 66 and 67 are connected to the main exit plane 65 at the edges of the main exit plane 65, extend downward from the main exit plane 65, and are connected to the pair of lateral entrance planes 63 and 64.

Here, when the amount of light passing through the main entrance planes 61 and 62 is localized to one side (the right side of FIG. 9) of the central axis line Z, the distribution angle pattern of the light may be inclined to the one side. The LED package is constructed such that the amount of light passing through the main entrance planes 61 and 62 is localized to one side (the right side) of the central axis line Z. For this construction, the first and second main entrance planes 61 and 62 having different centers of curvature are divided from each other by the central axis line Z, as illustrated in FIG. 9. The radius of curvature of the first main entrance plane 61 is larger than that of the second main entrance plane 62. Thus, two points P1 and P2 on the main entrance planes 61 and 62 at the same height from the LED chip 40 are spaced different distances D1 and D2 from the central axis line Z. distances D1 and D2.

The upper ends of the pair of lateral exit planes (i.e. the first lateral exit plane 66 and the second lateral exit plane 67) connected to the main exit plane 65 at the edges of the main exit plane 65 have the same height. Thus, the main exit plane 65 lies in a horizontal position.

The reflector 80 is designed such that the amount of light reflected toward the main exit plane 65 through the first lateral exit plane 66 is larger than the amount of light reflected toward the main exit plane 65 through the second lateral exit plane 67. Particularly, the reflector 80 is designed such that the reflection plane bordering the first lateral exit plane 66 is used to reflect light emitted through the first lateral exit plane 66 toward the main exit plane 65. Here, the first lateral exit plane 66 may be inclined to one side and its inclination angle can be determined such that the amount of light directly emitted through the main exit plane 65 without being reflected from the lateral exit plane is enhanced. In other words, the first angle between the first lateral exit plane 66 and the central axis line Z is larger than the second angle between the second lateral exit plane 67 and the central axis line Z so that light can be reflected at a larger angle from the reflection plane of the reflector 80 bordering the first lateral exit plane 66 to increase the amount of light in the right side of the central axis line Z.

FIG. 11 is a simulation diagram illustrating the distribution angles of light from the LED package according to the second embodiment of the present invention. As can be seen from FIG. 11, the majority of light emitted from the LED chip 40 is directly emitted outward from the LED package through the main entrance planes 61 and 62 and the main exit plane 67. Here, the emitted light is slightly localized to the right side of the central axis line Z. In the previous embodiment, the amount of light emitted from the LED package along the central axis line is reduced. In contrast, in this embodiment, the amount of light emitted from the LED package along the central axis line is not reduced. Specifically, light emitted in the left direction from the LED chip is reflected from the reflection plane with a large inclination angle bordering the first lateral exit plane and propagates in the right direction relative to the central axis line. Light emitted in the right direction from the LED chip is reflected from the reflection plane with a small inclination angle bordering the second lateral exit plane and propagates in the vertical direction in the right region. FIG. 12 compares the distribution angle pattern of light from the LED package according to the second embodiment of the present invention with that from a comparative LED package. Referring to FIG. 12, the LED package according to the second embodiment of the present invention shows a light distribution angle pattern inclined at a small angle from the central axis line around which a large amount of light is found. In contrast, the comparative LED package having a structure in which a TIR lens and a reflector are symmetric to each other with respect to a central axis line of an LED chip forms a light distribution angle pattern around the central axis line (i.e. around 0°).

In each of the LED packages according to the foregoing embodiments of the present invention, the base 20 is mounted with the LED chip 40 and the reflector 80 is bonded to the base 20 in a state in which the TIR lens 60 is coupled to the reflector 80, as explained above. The reflector 80 is preferably made of a metal material and is preferably bonded to the base 20 by SMT (see FIGS. 1 to 10).

For alignment of the reflector, alignment grooves are formed on the upper surface of the base and alignment protrusions are formed on the bottom surface of the reflector. The alignment protrusions are seated in the corresponding alignment grooves. The reflector can be mounted on the base for its alignment such that one side of each of the alignment protrusions is in close contact with the corresponding side of the corresponding alignment groove. The alignment protrusions are in close contact with the corresponding alignment grooves at the initial stage of reflow but the sides of the alignment protrusions are separated from the corresponding sides of the alignment grooves due to the fluidity of a solder during reflow, resulting in a misalignment of the reflector. As illustrated in FIG. 13, the originally intended tilt distribution angle of the LED package is 7° but is significantly changed to 8°, 11°, and 15° when the reflector is shifted by 150 μm, 300 μm, and more, respectively.

The present invention provides an LED package including a precisely aligned reflector designed to suppress its shift in a linear or rotational direction during SMT while ensuring its accurate initial alignment. The design of the reflector will be described below.

FIGS. 14 to 17 illustrate an LED package according to one embodiment of the present invention. The LED package includes: a base having a recess 24 for chip mounting and a chip mounting surface formed on the bottom of the recess 24; an LED chip 40 including a central axis line and perpendicular to the chip mounting surface; a lens 60, preferably a TIR lens, including exit planes from which light is emitted; and a reflector 80 coupled with the TIR lens 60. The LED package according to this embodiment is distinguished from the LED packages according to the foregoing embodiments in that the reflector 80 can be precisely aligned on the base 20 and the precise alignment is maintained during processing such as SMT. Therefore, it is noted that other elements are the same as those in one of the foregoing embodiments.

In this embodiment, the base 20 includes a printed circuit board having an electrode pattern and a plate formed with a recessed hole and bonded onto the printed circuit board. The base 20 includes a pair of alignment grooves 26 on the upper surface thereof. The pair of alignment grooves 26 are formed at one side of the base mounted with the LED chip 40. The pair of alignment grooves 26 are open laterally at both edge corners of one side of the base 20. Each of the alignment grooves 26 is closed at two inner sides thereof and is open at two outer sides thereof. The inner sides meet at right angles and the outer sides meet at right angles. Thus, the alignment groove is quadrangular in cross section. The two outer sides of each alignment groove 26 are open rather than closed by vulnerable thin walls. That is, the alignment grooves 26 are open laterally without thin walls.

The reflector 80 includes a pair of alignment protrusions 86 formed on the bottom surface thereof. The alignment protrusions 86 are fitted into the corresponding alignment grooves 26. The alignment protrusions 84 are formed at both edge corners of one side of the bottom surface of the reflector 80 and extend downward.

When the reflector 80 is mounted on the upper surface of the base 20 by SMT, the alignment protrusions 86 are inserted into the corresponding alignment grooves 26. As a result, one side of each of the alignment protrusions 86 is in close contact with the corresponding side (more specifically the closed side) of the corresponding alignment groove 26. This close contact allows the reflector 80 to be aligned in a correct position with respect to the base 20.

As mentioned above, when a solder is melted between the reflector 80 and the base 20, the reflector 80 slips in one direction and one side of each of the alignment protrusions 54 may be moved away from the corresponding side of the corresponding alignment groove 26. In this embodiment, a pair of alignment retaining grooves 27 are formed at both edge corners of the other side of the upper surface of the base 20 mounted with the LED chip 40 and a pair of alignment retaining protrusions 87 are formed at both edge corners of the other side of the bottom surface of the reflector 80. The alignment retaining protrusions 87 are fitted into the corresponding alignment retaining grooves 27 to prevent shift of the reflector 80 on the base 20. Here, each of the alignment retaining grooves 27 is quadrangular in cross section and has a structure in which two outer sides meet at right angles and are open laterally without thin edge walls.

The alignment protrusions 86 formed at one side of the bottom surface of the reflector 80 are fitted into the corresponding alignment grooves 26 formed at one side of the upper surface of the base 20 and the alignment retaining protrusions 87 formed at the other side of the bottom surface of the reflector 80 are fitted into the corresponding alignment retaining grooves 27 formed at the other side of the upper surface of the base 20 so that shift of the reflector 80 can be suppressed. This is enabled by fitting an embossed portion defined by the alignment grooves 26 and the alignment retaining grooves 27 on the upper surface of the base 20 into an engraved portion defined by the alignment protrusions 86 and the alignment retaining protrusions 87 on the bottom surface of the reflector 80.

The width of the alignment protrusions 86 is 1.2 times larger than that of the alignment retaining protrusions 87 parallel to the alignment protrusions 86. Particularly, the downward extension length L2 of each of the alignment retaining protrusions 87 is preferably shorter than the downward extension length L1 of the corresponding alignment protrusion 86. This allows the bottom surface of the alignment retaining groove 27 to be higher than the bottom surface of the corresponding alignment groove 26 having an electrode pattern, which prevents the occurrence of a short circuit when the alignment retaining protrusion 87 comes into contact with the electrode pattern.

One of the alignment protrusions 86 is diagonally opposite to one of the alignment retaining protrusions 87 and faces the other alignment retaining protrusion 87 in the direction parallel to one side surface of the reflector 80. Likewise, one of the alignment grooves 26 is diagonally opposite to one of the alignment retaining grooves 27 and faces the other alignment retaining groove 27 in the direction parallel to one side surface of the base 20.

The alignment retaining protrusions 87 and the alignment retaining grooves 27 may have various shapes. For example, each of the alignment retaining protrusions 87 and the alignment retaining grooves 27 may be in the form of a circular arc, as illustrated in (a) and (b) of FIG. 18. When the arc-shaped alignment retaining protrusions 87 are fitted into the corresponding arc-shaped alignment retaining grooves 27, both linear and rotational shifts of the reflector 80 can be more surely prevented. Each of the quadrangular alignment retaining grooves has a structure in which two sides crossing each other are open (i.e. a structure in which two sides are open in two lateral directions crossing each other), avoiding the need for thin walls defining the grooves. In contrast, the arc-shaped alignment retaining grooves 27 having no open sides are defined by sufficiently thick walls.

EXPLANATION OF REFERENCE NUMERALS

20 . . . Base
40 . . . LED chip
60 . . . TIR lens
80 . . . Reflector
61, 62, 63, 64 . . . Entrance planes
65, 66, 67 . . . Exit planes

The invention claimed is:
1. An LED package comprising:
a base comprising a chip mounting surface;
an LED chip comprising a central axis line perpendicular to the chip mounting surface;
a total internal reflection (TIR) lens having a refractive index higher than that of a medium covering the upper and side surfaces of the LED chip and comprising entrance planes bordering the medium and exit planes from which light entering through the entrance planes is emitted; and a reflector coupled to the TIR lens, wherein the entrance planes comprise main entrance planes having one or more radii of curvature and protruding toward the LED chip and a pair of lateral entrance planes connected to the main entrance planes at the edges of the main entrance planes and extending downward from the main entrance planes; the exit planes comprise a main exit plane located above the main entrance planes and a pair of lateral exit planes connected to the main exit plane at the edges of the main exit plane, extending downward from the main exit plane, and connected to the pair of lateral entrance planes; and two points on the main entrance planes at the same height from the LED chip are not equidistant from the central axis line such that the amount of light passing through the main entrance planes is localized to one side of the central axis line, wherein the main entrance planes comprise a first main entrance plane and a second main entrance plane divided from each other by the central axis line and the second main entrance plane is more downwardly biased than the first main entrance plane, and wherein the first main entrance plane has the same center of curvature and the same radius of curvature as the second main entrance plane.

2. The LED package according to claim 1, wherein the pair of lateral exit planes have different heights and the main exit plane is inclined from the horizontal.

3. The LED package according to claim 1, wherein the pair of lateral exit planes comprise a first lateral exit plane and a second lateral exit plane whose upper end is lower than that of the first lateral exit plane; and the main exit plane is inclined downward from the first lateral exit plane to the second lateral exit plane.

4. The LED package according to claim 3, wherein the reflector is designed such that the amount of light reflected toward the main exit plane through the first lateral exit plane is larger than that of light reflected toward the main exit plane through the second lateral exit plane.

5. The LED package according to claim 1, wherein the main entrance planes comprise a first main entrance plane and a second main entrance plane divided from each other by the central axis line and have different centers of curvature; and the radius of curvature of the first main entrance plane is larger than that of the second main entrance plane.

6. The LED package according to claim 1, wherein the pair of lateral exit planes are at different angles to the central axis line.

7. An LED package comprising:

a base comprising a chip mounting surface;

an LED chip comprising a central axis line perpendicular to the chip mounting surface;

a total internal reflection (TIR) lens having a refractive index higher than that of a medium covering the upper and side surfaces of the LED chip and comprising entrance planes bordering the medium and exit planes from which light entering through the entrance planes is emitted; and a reflector coupled to the TIR lens, wherein the entrance planes comprise main entrance planes having one or more radii of curvature and protruding toward the LED chip and a pair of lateral entrance planes connected to the main entrance planes at the edges of the main entrance planes and extending downward from the main entrance planes; the exit planes comprise a main exit plane located above the main entrance planes and a pair of lateral exit planes connected to the main exit plane at the edges of the main exit plane, extending downward from the main exit plane, and connected to the pair of lateral entrance planes; and two points on the main entrance planes at the same height from the LED chip are not equidistant from the central axis line such that the amount of light passing through the main entrance planes is localized to one side of the central axis line, and wherein the base comprises one or more alignment grooves formed at the edges of one side of the upper surface thereof and one or more alignment retaining grooves formed at the edges of the other side of the upper surface thereof; the reflector comprises one or more alignment protrusions formed at the edges of one side of the bottom surface thereof and one or more alignment retaining protrusions formed around the edges of the other side of the bottom surface thereof; and one side of each of the alignment protrusions is in tight contact with the corresponding side of the corresponding alignment groove and the alignment retaining protrusions are fitted into the corresponding alignment retaining grooves to prevent the alignment protrusions from being moved away from the corresponding sides of the alignment grooves.

8. The LED package according to claim 7, wherein each of the alignment grooves has a quadrangular cross-sectional shape in which two outer sides meet at right angles and are open.

9. The LED package according to claim 8, wherein each of the alignment retaining grooves has a quadrangular cross-sectional shape in which two outer sides meet at right angles and are open.

10. The LED package according to claim 7, wherein the alignment retaining grooves are in the form of circular arcs.

11. The LED package according to claim 7, wherein the alignment grooves are deeper than the alignment retaining grooves and the alignment protrusions extend more downward than the alignment retaining protrusions.

12. The LED package according to claim 7, wherein the alignment grooves are formed at both edge corners of one side of the upper surface of the base and the alignment retaining grooves are formed at both edge corners of the other side of the upper surface of the base.

13. An LED package comprising:

a base comprising a chip mounting surface;

an LED chip mounted on the chip mounting surface;

a lens comprising entrance planes on which light emitted from the LED chip is incident and exit planes from which light entering through the entrance planes is emitted; and a reflector coupled to the lens, wherein the base comprises one or more alignment grooves formed at the edges of one side of the upper surface thereof and one or more alignment retaining grooves formed at the edges of the other side of the upper surface thereof; the reflector comprises one or more alignment protrusions formed at the edges of one side of the bottom surface thereof and one or more alignment retaining protrusions formed around the edges of the other side of the bottom surface thereof; and one side of each of the alignment protrusions is in tight contact with the corresponding side of the corresponding alignment groove and the alignment retaining protrusions are fitted into the corresponding alignment retaining grooves to prevent the alignment protrusions from being moved away from the corresponding sides of the alignment grooves, and wherein each of the alignment grooves has a quadrangular cross-sectional shape in which two outer sides meet at right angles and are open.

14. The LED package according to claim 13, wherein each of the alignment retaining grooves has a quadrangular cross-sectional shape in which two outer sides meet at right angles and are open.

15. The LED package according to claim 13, wherein the alignment retaining grooves are in the form of circular arcs.

16. The LED package according to claim 13, wherein the alignment grooves are deeper than the alignment retaining grooves and the alignment protrusions extend more downward than the alignment retaining protrusions.

17. The LED package according to claim 13, wherein the alignment grooves are formed at both edge corners of one side of the upper surface of the base and the alignment retaining grooves are formed at both edge corners of the other side of the upper surface of the base.

* * * * *